United States Patent
Matsuda et al.

(10) Patent No.: US 11,024,787 B2
(45) Date of Patent: Jun. 1, 2021

(54) THERMOELECTRIC POWER GENERATION DEVICE

(71) Applicant: DENSO CORPORATION, Kariya (JP)

(72) Inventors: Takuya Matsuda, Kariya (JP); Shinya Kitagawa, Kariya (JP); Yoshiyuki Okamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 203 days.

(21) Appl. No.: 15/758,887

(22) PCT Filed: Sep. 13, 2016

(86) PCT No.: PCT/JP2016/076910
§ 371 (c)(1),
(2) Date: Mar. 9, 2018

(87) PCT Pub. No.: WO2017/047563
PCT Pub. Date: Mar. 23, 2017

(65) Prior Publication Data
US 2018/0287035 A1    Oct. 4, 2018

(30) Foreign Application Priority Data
Sep. 16, 2015   (JP) .............................. JP2015-183256

(51) Int. Cl.
*H01L 35/30*  (2006.01)
*H01L 35/32*  (2006.01)
(Continued)

(52) U.S. Cl.
CPC .............. *H01L 35/30* (2013.01); *F01N 5/025* (2013.01); *H01L 35/32* (2013.01); *H01L 35/34* (2013.01); *H02N 11/00* (2013.01); *H02N 11/002* (2013.01)

(58) Field of Classification Search
CPC ....... H01L 35/30; H01L 35/32; H01L 35/325; H01L 35/34; F01N 5/025
See application file for complete search history.

(56) References Cited

U.S. PATENT DOCUMENTS

2005/0172993 A1    8/2005  Shimoji et al.
2006/0157102 A1*   7/2006  Nakajima .............. F01N 5/025
                                                    136/205
(Continued)

FOREIGN PATENT DOCUMENTS

CN    201966842 U    9/2011
JP    H11036981 A    3/1999
(Continued)

*Primary Examiner* — Golam Mowla
(74) *Attorney, Agent, or Firm* — Harness, Dickey & Pierce, P.L.C.

(57) ABSTRACT

A second fluid having a higher temperature than a first fluid, which flows in a duct, flows in contact with outside fins. Opposed regions of each power generation module and the duct apply pressure to and in contact with each other. Opposed regions of each power generation module and a corresponding one of a first outside plate and a second outside plate apply pressure to and in contact with each other. The duct is formed from a material having a thermal expansion coefficient larger than the first outside plate and the second outside plate. Additionally, two power generation modules are not necessarily required, and at least one power generation module is provided.

8 Claims, 7 Drawing Sheets

(51) Int. Cl.
*H01L 35/34* (2006.01)
*H02N 11/00* (2006.01)
*F01N 5/02* (2006.01)

(56) References Cited

U.S. PATENT DOCUMENTS

| | | | |
|---|---|---|---|
| 2007/0045044 A1* | 3/2007 | Sullivan | F01N 13/1888 |
| | | | 181/268 |
| 2011/0265838 A1 | 11/2011 | Kambe | |
| 2012/0012146 A1* | 1/2012 | Salzgeber | H01L 35/30 |
| | | | 136/205 |
| 2012/0298163 A1* | 11/2012 | Brehm | H01L 35/10 |
| | | | 136/210 |
| 2013/0213448 A1* | 8/2013 | Moczygemba | H01L 35/32 |
| | | | 136/201 |
| 2015/0303365 A1 | 10/2015 | Tominaga et al. | |

FOREIGN PATENT DOCUMENTS

| | | |
|---|---|---|
| JP | 2005223131 A | 8/2005 |
| JP | 2011101460 A | 5/2011 |
| JP | 2011109837 A | 6/2011 |
| JP | 2011181767 A | 9/2011 |
| WO | WO-2010084718 A1 | 7/2010 |
| WO | WO-2014064945 A1 | 5/2014 |

* cited by examiner

THERMOELECTRIC POWER GENERATION DEVICE

CROSS REFERENCE TO RELATED APPLICATIONS

This application is a U.S. National Phase Application under 35 U.S.C. 371 of International Application No. PCT/JP2016/076910 filed on Sep. 13, 2016 and published in Japanese as WO 2017/047563 A1 on Mar. 23, 2017. This application is based on and claims the benefit of priority from Japanese Patent Application No. 2015-183256 filed on Sep. 16, 2015. The entire disclosures of all of the above applications are incorporated herein by reference.

TECHNICAL FIELD

The present disclosure relates to a thermoelectric power generation device that thermoelectrically generates electric power by the use of a high-temperature fluid and a low-temperature fluid. In particular, the present disclosure relates to a thermoelectric power generation device utilizing an exhaust gas of a vehicle.

BACKGROUND ART

There is conventionally proposed a thermoelectric power generation device described in Patent Document 1. In this device, many thermoelectric modules can be pressed and fixed by a small number of low temperature cooling medium blocks and fastening members. Further, many thermoelectric modules can be simply sandwiched between a tube of a high temperature medium flow passage and a block of a cooling medium flow passage at a small number of fastening portions and can be arranged in a suitable pressing state.

For this reason, an even number of high temperature medium flow passages are arranged radially and the thermoelectric modules are arranged on both surfaces of each high temperature medium flow passage arranged radially and the low temperature medium flow passages are arranged in such a way as to sandwich the thermoelectric module between the low temperature medium flow passage and each of the high temperature medium flow passages. Further, a fastening member such as a bolt is passed through the low temperature medium flow passage in a direction to cross a direction in which the high temperature medium flows to thereby fix the thermoelectric modules in a state where the thermoelectric module is sandwiched by the high temperature medium flow passage and the low temperature medium flow passage.

PRIOR ART DOCUMENT

Patent Document

Patent Document 1: JP 2011-109837 A

According to a technique of the Patent Document 1, the fastening member such as the bolt for fastening is newly required, which hence increases the number of parts, a material cost of a product, and a manufacturing cost. Further, this increase in the number of parts results in increasing a heat capacity which does not contribute to a heat exchange performance. This causes a decrease in a transfer amount of effective heat at an initial stage of operation of the power generation device and hence causes a decrease in a power generation amount, so a sufficient power generation performance cannot be produced. Further, there is a case where a stable power generation performance cannot be produced, because a surface pressure of a pressure contact portion is reduced by the bolt being loosened. Descriptions of the patent document cited as a prior art can be introduced or incorporated as descriptions of technical elements described in the present specification.

SUMMARY OF INVENTION

The present disclosure addresses the above issues. Thus, it is an objective of the present disclosure to provide a thermoelectric power generation device that can inhibit a decrease in a power generation performance.

To achieve the objective, a thermoelectric power generation device in an aspect of the present disclosure includes: a duct in which a first fluid flows; a first power generation module and a second power generation module which are in contact with opposed outside surfaces of the duct respectively and each of which includes therein a thermoelectric power generation element; a first outside plate and a second outside plate each of which is in contact with an outside surface of a corresponding one of the first power generation module and the second power generation module on its opposite side from the duct, both end portions of the first outside plate and both end portions of the second outside plate respectively welded to each other; and outside fins each of which is provided on an outside surface of a corresponding one of the first outside plate and the second outside plate on its opposite sides from a corresponding one of the first power generation module and the second power generation module. A second fluid having a higher temperature than the first fluid flows in contact with the outside fins. A region of each of the first power generation module and the second power generation module, and a region of the duct, which are opposed to each other, apply pressure to and are in contact with each other. A region of each of the first power generation module and the second power generation module and a region of a corresponding one of the first outside plate and the second outside plate, which are opposed to each other, apply pressure to and are in contact with each other. The duct is formed from a material having a coefficient of thermal expansion larger than the first outside plate and the second outside plate. Additionally, the two power generation modules are not necessarily required, and at least one power generation module may be provided.

In this aspect, the duct is expanded by the heat of the first fluid. Then, the duct is formed of a material having the coefficient of thermal expansion larger than the first outside plate and the second outside plate. By the expansion of the duct, the pressure is further applied to the portion between the power generation module and the duct and to the portions between the power generation module and the first outside plate and the second outside plate, which hence can inhibit the gap from being produced at the respective portions (the respective pressure contact portions). As a result, the heat from the first outside plate and the second outside plate is well transferred to the power generation modules via the respective pressure contact portions, so a decrease in the power generation efficiency can be inhibited.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinafter, a plurality of embodiments will be described with reference to accompanying drawings. In some cases, parts corresponding to terms described in the preceding embodiment in the respective embodiments will be denoted by the same reference signs and their duplicate descriptions will be omitted. In a case where a part of a construction is described in the respective embodiments, the other embodiment described precedently can be applied to the other parts of the construction.

Not only a combination of parts which are specified to be completely combined with each other in the respective embodiments but also, even if not specified, a partial combination of the embodiments can be made if a problem is not caused in the combination of them.

First Embodiment

Figure 1:
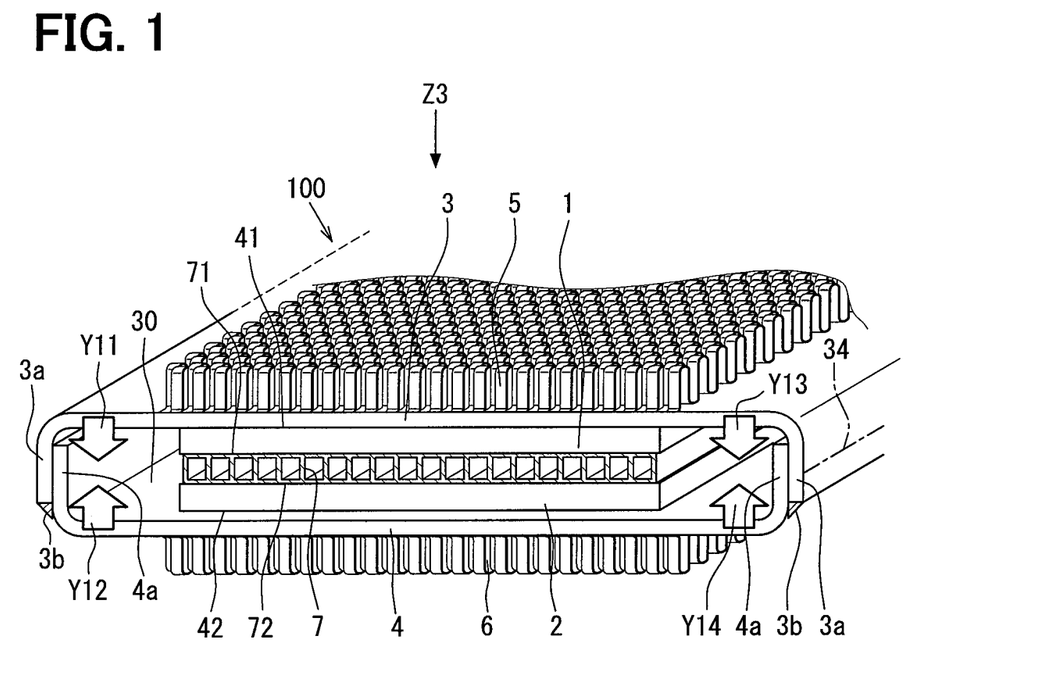
FIG. 1 is a construction diagram, partially in a cross section, of a thermoelectric power generation device in a first embodiment.

Hereinafter, a first embodiment will be described in detail by the use of FIG. 1 to FIG. 6. FIG. 1 is a construction view, partially in a cross section, of a thermoelectric power generation device 100. Power generation modules 1, 2 are received in an airtight case formed in a shape of a flat box so as to prevent elements from being oxidized. Hence, each of the power generation modules 1, 2 can be seen only as a box shaped like a plate when viewed from the outside, but many p-type semiconductor elements and n-type semiconductor elements are alternately connected to each other like a net in the airtight case constructed of a thin stainless steel plate. When the power generation module has one surface brought into contact with a high temperature part and has the other surface brought into contact with a low temperature part, the power generation module generates electric power. When the power generation modules 1, 2 are discriminated from each other, they are also referred to as a first power generation module 1 and a second power generation module 2.

Respective portions of: opposite portions of the first power generation module 1 and a duct 7; opposite portions of the second power generation module 2 and the duct 7; opposite portions of the first power generation module 1 and a first outside plate 3; and opposite portions of the second power generation module 2 and a second outside plate 4 are brought into a state where a pressure is applied to each other and where the respective portions are brought into contact with each other. These portions in the state where the pressure is applied to each other and where the respective portions are brought into contact with each other are referred to as pressure contact portions.

One surface of the power generation module 1 is brought into contact with the first outside plate 3, which forms the high temperature part, via the pressure contact portions 41, and one surface of the power generation module 2 is brought into contact with the second outside plate 4, which forms the high temperature part, via the pressure contact portions 42. The first outside plate 3 and the second outside plate 4 are collectively simply referred to as outside plates 3, 4 in some cases. The first outside plate 3 and the second outside plate 4 are bent in such a way that both their ends are welded to each other.

Bent portions 3a, 4a, which are portions bent in this manner, are continuously welded by a seam welding or a laser welding along a direction in which a low-temperature fluid forming a first fluid flows through the duct 7, thereby being welded and joined to each other. An internal space 30 surrounded by the first outside plate 3 and the second outside plate 4 is formed by this welding. In the internal space 30 surrounded by the first outside plate 3 and the second outside plate 4, the power generation modules 1, 2 and the duct 7 are received. The duct 7 is made of aluminum, and the low-temperature fluid made of a cooling water of an automobile engine flows in the duct 7. The duct 7 has flat obverse and reverse outside surfaces. A coefficient of thermal expansion of aluminum is 23. 1 and a coefficient of thermal expansion of stainless steel 444T of a material of the outside plates 3, 4 is 11. 5 as an example. A coefficient of thermal expansion means an expansion (μm) in a unit length (1 m) of a material when its temperature is raised by 1° C. For example, in a case where a coefficient α of thermal expansion of a material is 11.5, when the temperature of the material is raised by 1° C., the material expands by 11.5 μm per 1 m. Hence, the duct 7 made of aluminum is larger in the coefficient of thermal expansion than the outside plates 3, 4 made of stainless steel. In this regard, a coefficient of thermal expansion of each of zinc, duralumin, brass, copper, and magnesium is respectively 30.2, 21.6, 17.5, 16.5, and 25.4 and is larger than the coefficient of thermal expansion of each of the outside plates 3, 4 made of stainless steel, so these materials or composites of these materials can be also used as the material of the duct 7.

Each of the first outside plate 3 and the second outside plate 4 is constructed of a stainless steel plate which is smaller in the coefficient of thermal expansion than aluminum. Outside fins 5, 6 are provided respectively on sides (an upper side and a lower side in FIG. 1), which are opposite to the power generation modules, of the outside plates 3, 4. An exhaust gas of an automobile engine which becomes a high-temperature fluid flows in contact with the outside fins 5, 6. Inside surfaces of other surfaces of the power generation modules 1, 2 are brought into contact with the outside surfaces of the duct 7 which forms the low temperature part. An interior of the duct 7 is partitioned into a plurality of divided passages and an engine cooling water which becomes the low-temperature fluid flows in the respective divided passages.

In this regard, it is the thermoelectric power generation device 100 made of one power generation unit that is shown in FIG. 1, but the power generation unit like this is usually constructed of a plurality of layers. Also in this case, the high-temperature fluid flows in contact with the outside fins 5, 6 which are positioned between the laminated power generation units 100.

When the first outside plate 3 and the second outside plate 4 are combined with each other, the first outside plate 3 and the second outside plate 4 are pressed as shown by arrows Y11 to Y14 in such a way that the bent portions 3a, 4a increase their overlapping portions. The bent portions 3a, 4a are welded to each other linearly in a state where they are pressed at welded portions 34 by the seam welding or the laser welding. Hence, a product is completed in a state where a stress to sandwich the power generation modules 1, 2 is applied to the first outside plate 3 and the second outside plate 4.

In this way, the power generation module 1 is brought into close contact with the first outside plate 3 and the duct 7, and the power generation module 2 is brought into close contact with the second outside plate 4 and the duct 7. In other words, a pressing force by the stress is applied to the portions between the duct 7 and the power generation modules 1, 2, the portion between the power generation module 1 and the first outside plate 3, and the portion between the power generation module 2 and the second outside plate 4, whereby pressure contact portions 41, 71, 72, 42 (which are also referred to as pressure contact portions 41 to 42) are formed between these.

Figure 2:
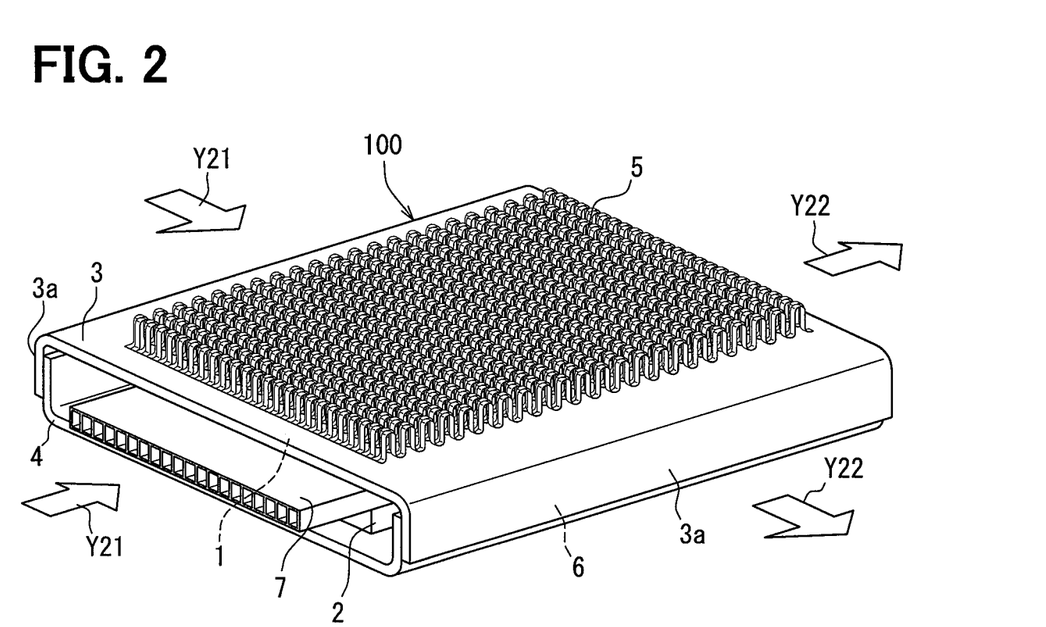
FIG. 2 is a perspective view of the thermoelectric power generation device in the first embodiment.

FIG. 2 is a perspective view of the whole of the thermoelectric power generation device 100. The thermoelectric power generation device 100 is a laminated body constructed of the outside fin 5, the first outside plate 3, the power generation module 1, the duct 7, the power generation module 2, the second outside plate 4, and the outside fin 6 from above to below in FIG. 2. In the duct 7, the low-temperature fluid flows as shown by arrows Y21, Y22. In the outside fins 5, 6, the high-temperature fluid flows in contact with the outside fins 5, 6 as shown by arrows Y21, Y22, whereby the high-temperature fluid exchanges heat with the outside fins 5, 6.

Figure 3:
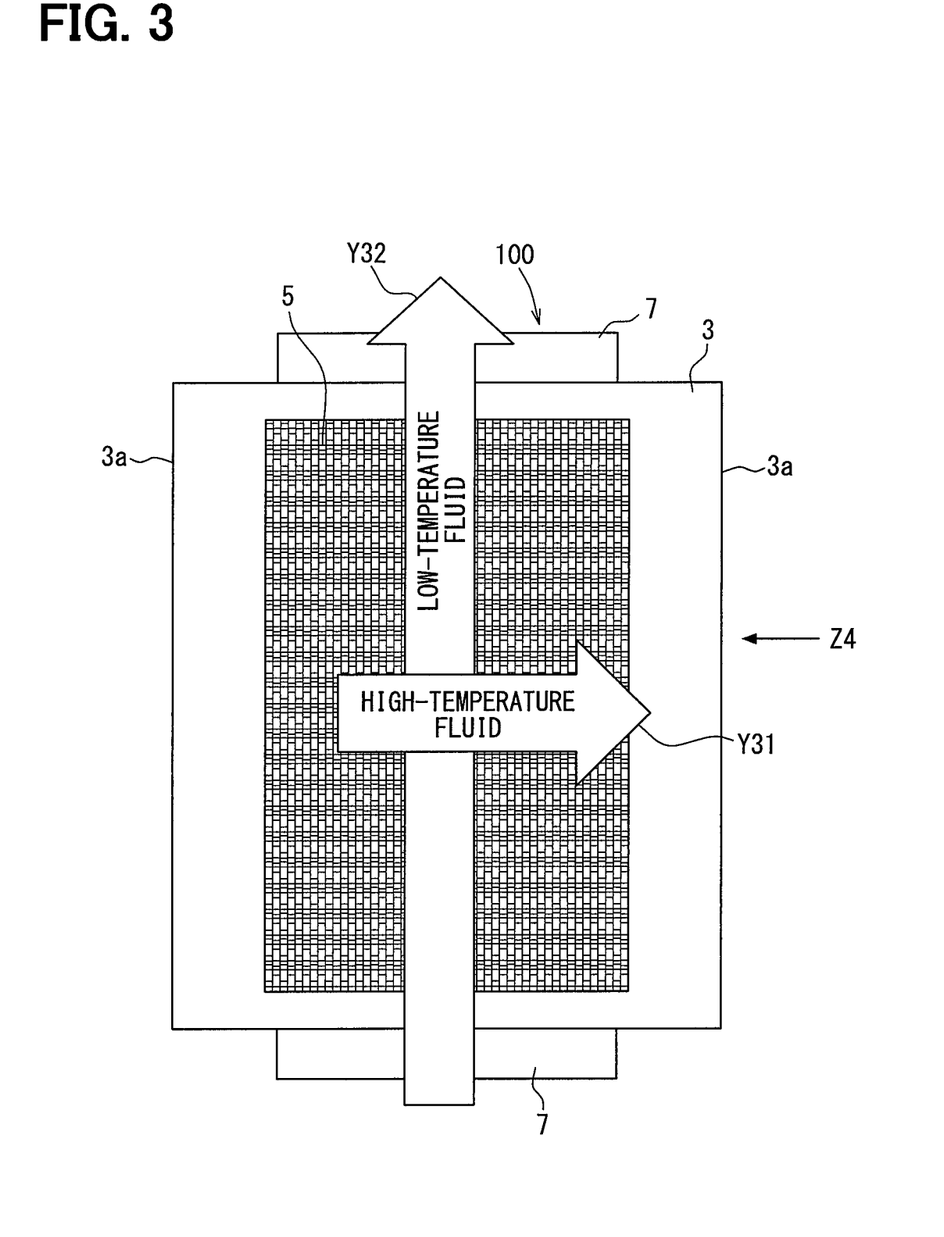
FIG. 3 is a plan view of the thermoelectric power generation device, when viewed from a direction shown by an arrow Z3 of FIG. 1, in the first embodiment.
Figure 4:
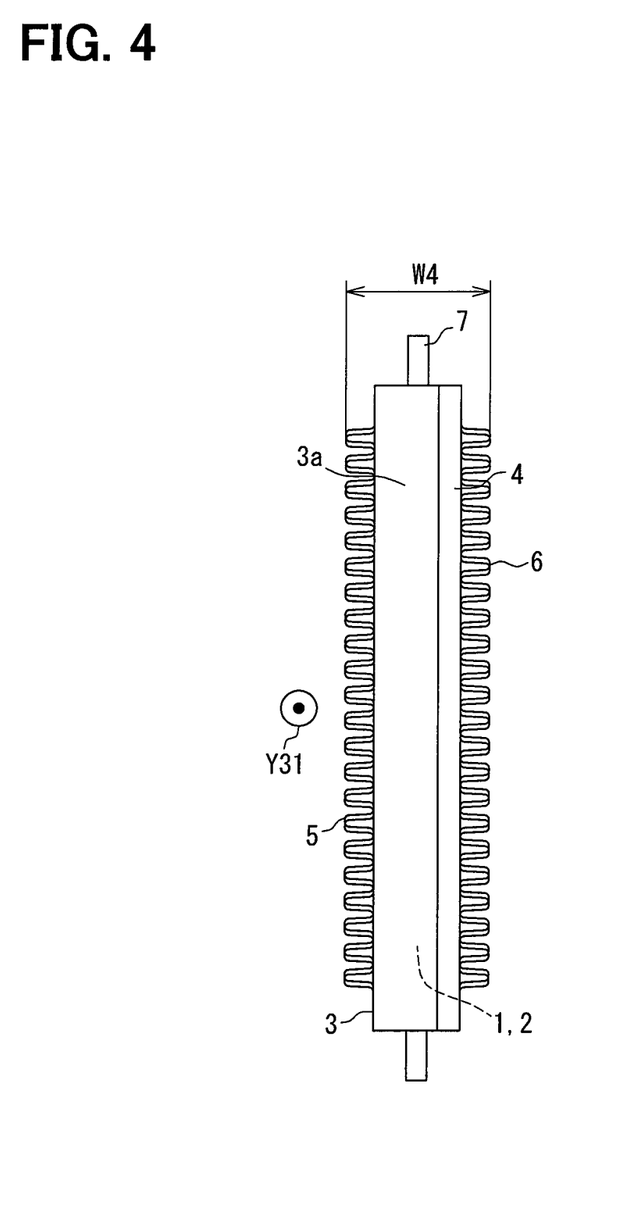
FIG. 4 is a right side view of the thermoelectric power generation device, when viewed from a direction shown by an arrow Z4 of FIG. 3, in the first embodiment.

FIG. 3 shows a construction, in a plan view, of the thermoelectric power generation device 100, when viewed from a direction shown by an arrow Z3 of FIG. 1. FIG. 4 is a right side view of the thermoelectric power generation device 100, when viewed from a direction shown by an arrow Z4 of FIG. 3. A direction shown by an arrow Y31 of FIG. 3 is a direction in which the high-temperature fluid flows. Further, the engine cooling water which becomes the low-temperature fluid flows in a direction orthogonal to the direction in which the high-temperature fluid flows.

The low-temperature fluid flows in the duct 7 which has a plurality of rectangular flow passages arranged and divided in a central portion of FIG. 1. On one surface side and on the other surface side of the duct 7, the power generation modules 1, 2 are arranged. The pair of power generation modules 1, 2 sandwiches the duct 7 in the inside and the outsides of the pair of power generation modules 1, 2 are sandwiched by the first outside plate 3 and the second outside plate 4. A width W4 between the outside fins 5, 6 is 35 mm as an example.

Figure 5:
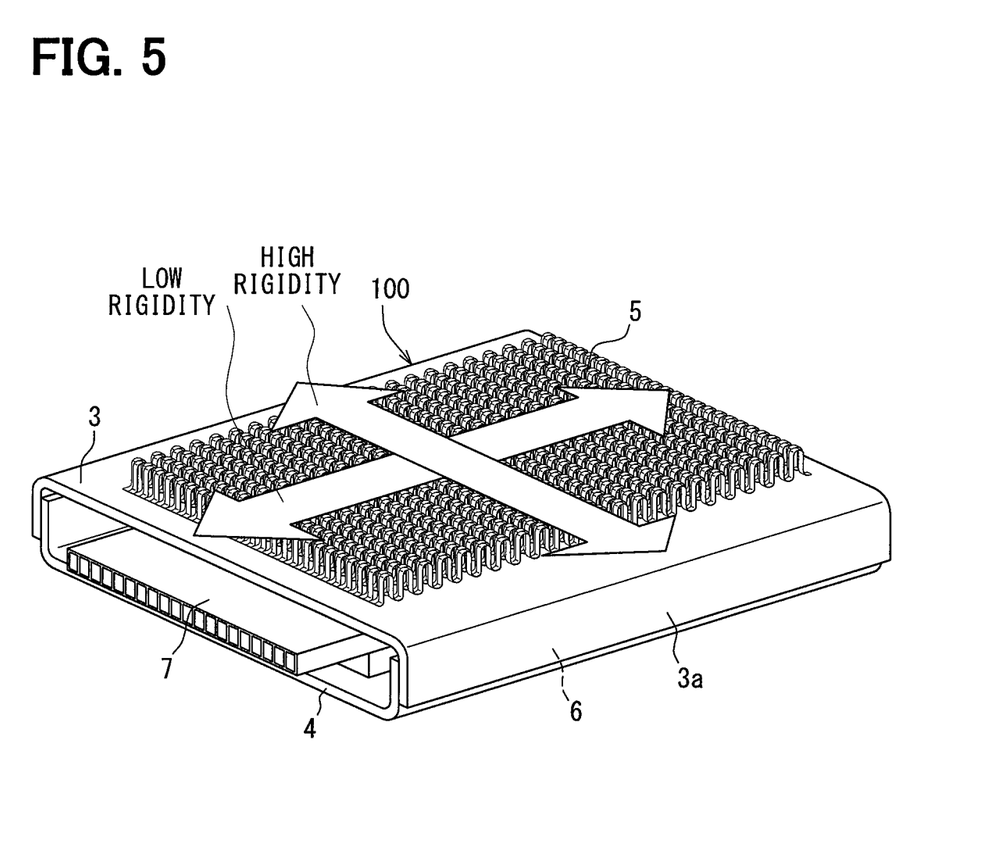
FIG. 5 is a perspective view to illustrate a rigidity of an outside fin of the thermoelectric power generation device in the first embodiment.

FIG. 5 is a perspective view to illustrate a rigidity of each of the outside fins 5, 6. Each of the outside fins 5, 6 is constructed of an assembly of a plurality of wavy portions. Each of the outside fins 5, 6 is easy to expand or contract and has a low rigidity in a direction in which the wave portions expand in a wavy shape. On the other hand, each of the outside fins 5, 6 is hard to expand or contract and has a high rigidity in a direction which is orthogonal to the direction or in a direction in which the wave portions overlap.

Further, in FIG. 1, a bending stress is applied to each of the first outside plate 3 and the second outside plate 4 by an effect of the pressing forces shown by the arrows Y11 to Y14. Hence, each of the first outside plate 3 and the second outside plate 4 needs to have a rigidity to resist the bending stress. Hence, it is also recommended that each of the first outside plate 3 and the second outside plate 4 has a rigidity increased in a left and right direction orthogonal to the arrows Y11, Y12 of FIG. 1, that is, in a direction to couple the bent portions 3a, 4a. As is clear from FIG. 3 and FIG. 4, the direction to couple the bent portions 3a, 4a is a direction shown by the arrow Y31 in which the high-temperature fluid flows. Therefore, as shown in FIG. 5, in each of the outside fins 5, 6, the direction shown by the arrow Y31 in which the high-temperature fluid flows is made the direction in which wave portions overlap and the rigidity is increased in the direction, whereas the direction orthogonal to the direction is made the direction in which wave portions expand in the wavy shape and the rigidity is decreased in the direction.

Figure 6:
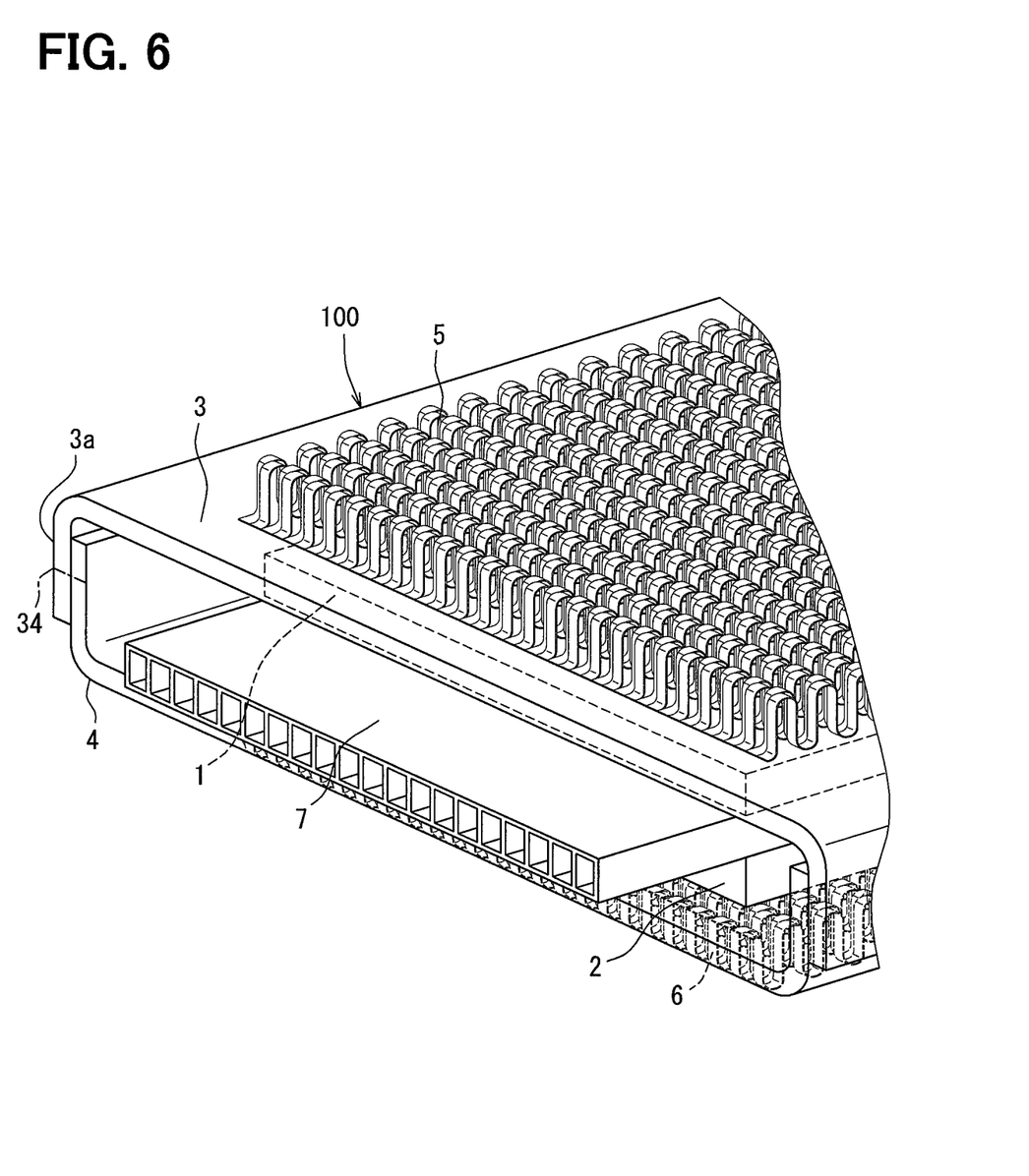
FIG. 6 is an enlarged view of a part of the outside fin of the thermoelectric power generation device in the first embodiment.

FIG. 6 is an enlarged view of a portion of the outside fin 5. The outside fin 5 bent in a wavy shape has a low rigidity in a direction in which waves travel and has a high rigidity in a direction in which waves overlap. When the outside fin 5 is brazed to the first outside plate 3, the rigidity of the first outside plate 3 is also made high. As a result, a gap to impair a heat transfer are hard to be made between the first outside plate 3 and the power generation module 1 and between the second outside plate 4 and the second power generation module 2. In this regard, in FIG. 6, as the outside fins 5, 6, offset fins are employed in which positions of adjacent fins are divided in such a way to be slightly offset from each other. However, the outside fins 5, 6 are not limited to this, but a wave fin in which positions of adjacent fins are not offset from each other may be employed.

In this regard, a heat conducting member such as a graphite sheet may be sandwiched in the pressure contact portions in which the gaps are likely to be made. When the heat conducting member like this is provided in the pressure contact portions 41 to 42, the heat conducting member can absorb small height differences or small recesses and projections, which cause the gaps in the pressure contact portions 41 to 42, and can keep a thermal conductivity. Further, a coefficient of thermal expansion of the heat conducting member sandwiched between the pressure contact portions 41 to 42 is preferably as large as possible.

Operations and effects of the first embodiment will be described. The first embodiment includes: the duct 7 in which the first fluid flows; and the power generation modules 1, 2 which are brought into contact with the outside surfaces, which are opposite to each other, of the duct 7 and in which thermoelectric power generation elements are received. Further, the first embodiment includes the first outside plate 3 and the second outside plate 4 which are brought into contact with outsides, which are sides opposite to the duct 7, of the power generation modules 1, 2 respectively and which are joined to each other.

Further, the first embodiment includes the outside fins 5, 6 which are provided respectively on outsides, which are sides opposite to the power generation modules, of the first outside plate 3 and the second outside plate 4 and in which a second fluid flows. Then, the pressure contact portions 41 to 42 are formed between the power generation modules 1, 2 and the duct 7 and between the power generation module 1 and the first outside plate 3 and between the power generation module 2 and the second outside plate 4.

Still further, each of the first outside plate 3 and the second outside plate 4 has a bending stress applied thereto, and the duct 7 is formed of a material having a coefficient of thermal expansion larger than that of the first outside plate 3 and the second outside plate 4. According to this, the duct 7 is expanded by the heat of the first fluid. Hence, the pressures at the pressure contact portions 41 to 42 are kept by a synergy effect of the expansion of the duct 7 and the bending stress, which hence inhibits a gap from being produced at the pressure contact portions 41 to 42. For this reason, heat from the first outside plate 3 and the second outside plate 4 is well transmitted to the power generation modules 1, 2 via the pressure contact portions 41 to 42, whereby a power generation efficiency is not reduced. Further, the welding is used so as to cause the bending stress, so a useless heat capacity such as a bolt is not increased and hence heat effective for the power generation can be easily transferred.

Second Embodiment

Next, a second embodiment will be described. Here, in the second embodiment, the same reference signs as in the first embodiment denote the same constructions as in the first embodiment and the preceding descriptions will be used therefor.

Figure 7:
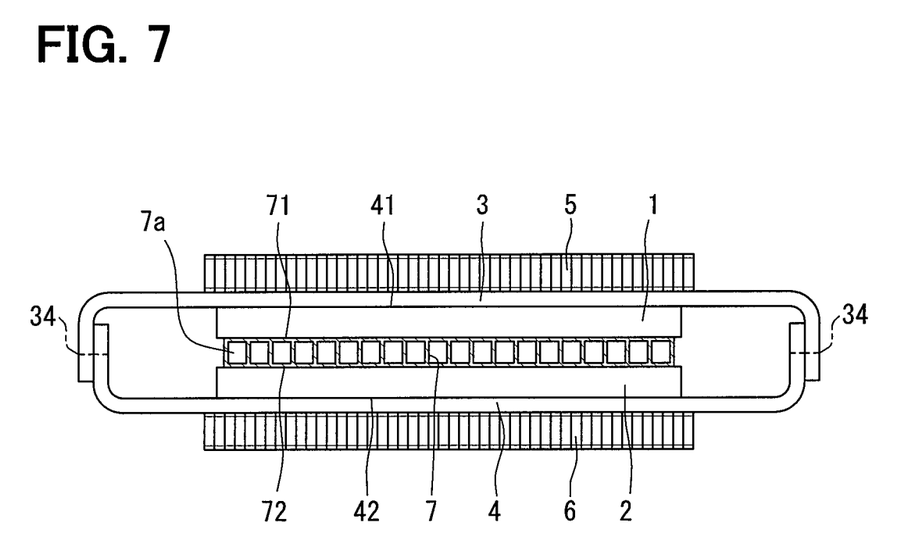
FIG. 7 is a plan view of a thermoelectric power generation device in a second embodiment.

FIG. 7 shows a construction, in a front view, of a thermoelectric power generation device to show a second embodiment. As shown in FIG. 7, in the second embodiment, a size in an up and down direction of the duct 7 arranged in a central portion is made large to thereby easily apply a pressing force based on a thermal expansion to the first power generation module 1 and the second power generation module 2, which are arranged above and below the duct 7, by the thermal expansion. Here, an aspect ratio is a ratio of a long side to a short side in a rectangle. As shown in FIG. 7, an interior of the duct 7 is divided into a plurality of divided passages 7a and a sectional shape of each divided passage 7a is a rectangle. An engine cooling water flows separately in each of the divided passages 7a and exchanges heat with the duct 7, eventually, the power generation modules 1, 2 via inside walls of the divided passages 7a. Then, the power generation modules 1, 2 generate the electric power by a temperature difference between a low temperature on the side of the duct 7 and a high temperature on the side of each of the first outside plate 3 and the second outside plate 4. A ratio of a long side to a short side, which is an aspect ratio, in a sectional shape of the divided passage 7a of the duct 7 is roughly 1 of a square as shown in FIG. 1 in the first embodiment. However, an aspect ratio of the divided passage 7a of the duct 7 in the second embodiment is larger than 1, that is, the divided passage 7a of the duct 7 is a rectangle, and a direction in which the long side extends is an up and down direction of the duct 7, which is a direction to connect the power generation modules 1, 2.

A modification of the second embodiment will be described. The shape of the each of the plurality of divided passages 7a of the duct 7 is made the rectangle, but the shape may be an oval shape having a longest diameter and a short diameter orthogonal to the longest diameter or a vertically long shape such as a shape of a letter D. Here, the oval shape referred here roughly includes a shape of an egg, an elliptical shape, or an ellipsoidal shape. Then, a vertically long direction in which the long side extends or the longest diameter extends only needs to be made the up and down direction of the duct 7, in other words, a direction to connect the power generation module 1 and the power generation module 2. In a case of the shape of a letter D, a lateral direction in which a diameter is large becomes the vertically long direction.

Operations and effects of the second embodiment will be described. According to the second embodiment, the duct 7 has the plurality of divided passages 7a formed therein, and the sectional shape of each of the divided passages 7a is the vertically long shape such as the rectangle, the oval shape, or the shape of a letter D, and the first fluid flows separately in each of the divided passages 7a. Then, the sectional shape of the divided passage 7a is the vertically long shape such as the rectangle, the oval shape, or the shape of a letter D. Then, a vertically long direction such as the long side of the rectangle or a direction in which the longest diameter of the oval shape extends is a direction to connect the power generation module 1 and the second power generation module 2.

According to this, the duct 7 easily causes a large thermal expansion in the vertically long direction such as a direction of the long side in the divided passage 7a or a direction in which the longest diameter extends. As a result, the pressure is easily applied to the respective pressure contact portions 41 to 42 by the thermal expansion in the vertically long direction of the duct 7. As a result, this inhibits a gap from being produced at the pressure contact portions 41 to 42 and hence heat from the duct 7, the first outside plate 3, and the second outside plate 4 is well transferred to the power generation modules 1, 2 via the respective pressure contact portions 41 to 42, which hence can inhibit a power generation efficiency from being reduced.

Third Embodiment

Figure 8:
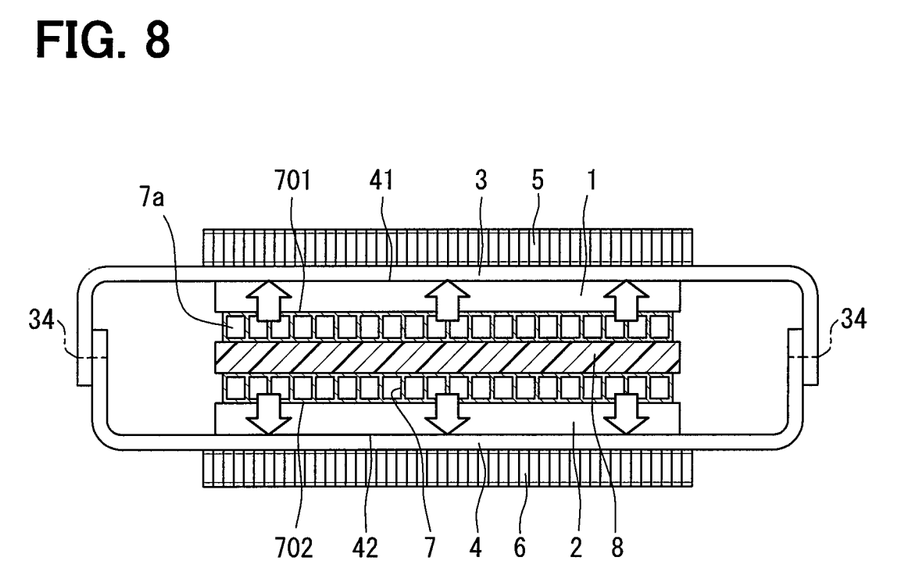
FIG. 8 is a plan view of a thermoelectric power generation device in a third embodiment.

Next, a third embodiment will be described. Portions different from those in the above embodiments will be described. In FIG. 8, the first power generation module 1 and the second power generation module 2 are arranged in contact with the first outside plate 3 and the second outside plate 4 between the first outside plate 3 and the second outside plate 4. Then, the duct 7 is arranged between the first power generation module 1 and the second power generation module 2, and the duct 7 is constructed of divided ducts of a first duct 701 and a second duct 702. Then, between the first duct 701 and the second duct 702, a central member 8 is arranged which has a coefficient of thermal expansion larger than that of the first duct 701 and the second duct 702. The central member 8 does not break into a passage of heat transfer necessary for power generation and hence does not increase a thermal resistance of a heat transfer passage. As the central member 8 not only metal but also synthetic resin or ceramic having a large coefficient of thermal expansion can be used.

Operations and effects of the third embodiment will be described. According to the third embodiment, the duct 7 is constructed of the first duct 701 and the second duct 702 which are arranged in a manner opposed to each other. Then, between the first duct 701 and the second duct 702, the central member 8 formed of a material having a coefficient of thermal expansion larger than that of the first duct 701 and the second duct 702, is arranged.

According to this, the whole of the duct 7 is expanded by the thermal expansion of the central member 8 to thereby apply a pressure to the pressure contact portions 41 to 42, which hence can inhibit a gap from being produced at the pressure contact portions 41 to 42. As a result, the heat from the ducts 701, 702 and the first outside plate 3 and the second outside plate 4 is well transferred to the power generation modules 1, 2 via the pressure contact portions 41 to 42, which hence reduces a decrease in the power generation efficiency.

Fourth Embodiment

Next, a fourth embodiment will be described. In the fourth embodiment shown in FIG. 9, each of side walls on both sides of the duct 7 is made into a flexible wall part 7*f* whose sectional shape is formed in a shape of bellows easily deformed. A duct like this can be easily constructed by an extrusion molding. Then, the central member 8 having a coefficient of thermal expansion larger than that of the duct 7 is arranged in the center of the duct 7. The duct 7 constructs a fluid passage in which the engine cooling water flows and which is made of aluminum. The duct 7 is an assembly of a plurality of divided flow passages and the engine cooling water flows separately in each of the rectangular flow passages. The central member 8 having a coefficient of thermal expansion larger than that of the duct 7 is arranged in such a way as to cross at least a part of the rectangular flow passages.

Figure 9:
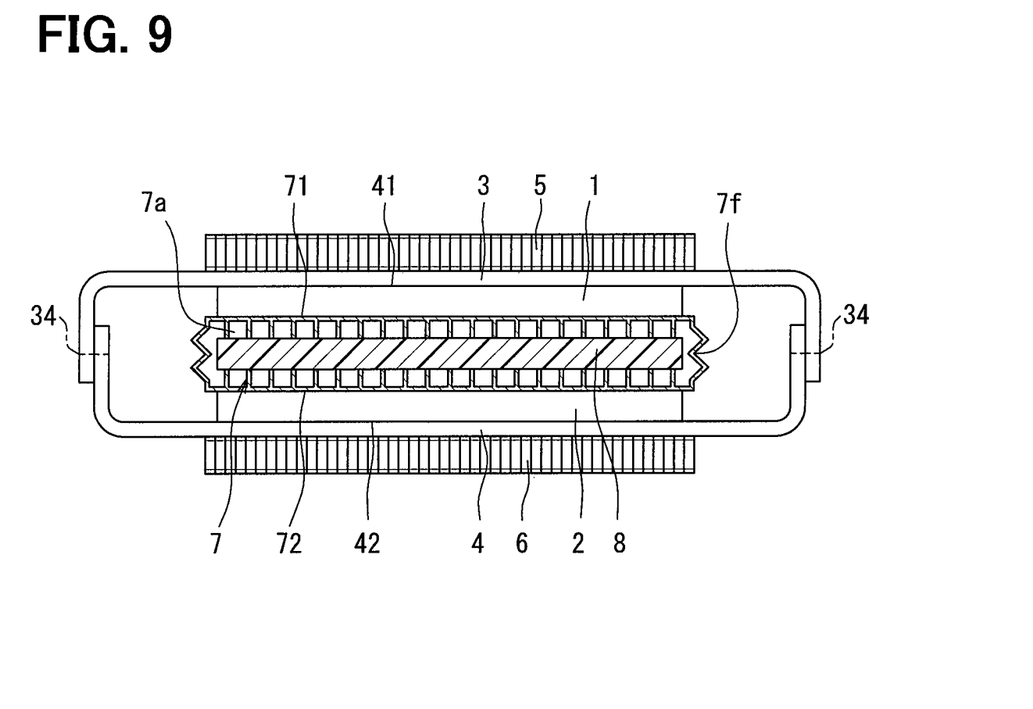
FIG. 9 is a plan view of a thermoelectric power generation device in a fourth embodiment.

Further, the bellows parts which become the flexible wall parts 7*f* extended by the thermal expansion of the central member 8 are formed on the side walls on both sides of the duct 7. Still further, the central member 8 having a large coefficient of thermal expansion can be constructed of synthetic resin or ceramic.

Operations and effects of the fourth embodiment will be described. According to the fourth embodiment, the central member 8 having a coefficient of thermal expansion larger than that of the duct 7 is inserted into the central portion of the duct 7. According to this, the pressure is applied to the pressure contact portions 41 to 42 by bonding the outside plates 3, 4 by the welded portions 34 and by the duct 7 being expanded and extended by the thermal expansion of the central member 8. As a result, this can inhibit a gap from being produced at the pressure contact portions 41 to 42 and hence can well transfer heat from the duct 7, the first outside plate 3, and the second outside plate 4 to the power generation modules 1, 2 via the pressure contact portions 41 to 42.

Further, the flexible wall parts 7*f* extended by the thermal expansion of the central member 8 are formed on the side walls of the duct 7. According to this, the flexible wall parts 7*f* are easily extended by the thermal expansion of the central member 8, so the duct 7 are extended in the up and down direction of FIG. 9 by the thermal expansion of the central member 8. This can apply the pressure to the pressure contact portions 41 to 42 and hence inhibits the gap to impair heat transfer from being produced at the pressure contact portions 41 to 42. As a result, the heat from the duct 7, the first outside plate 3, and the second outside plate 4 is well transferred to the power generation modules 1, 2, whereby a decrease in the power generation efficiency is reduced.

Fifth Embodiment

Next, a fifth embodiment will be described. In the fifth embodiment shown in FIG. 10, side walls on both upper and lower sides of the duct 7 are in close contact with the first power generation module 1 and the second power generation module 2 respectively. Further, the first power generation module 1 is in contact with the first outside plate 3 via an inclusion 9 arranged on a side opposite to the duct 7, and the second power generation module 2 is in contact with the second outside plate 4 via the inclusion 9 arranged on a side opposite to the duct 7. Although the inclusion 9 is shown only on the side of the first outside plate 3, the inclusion 9 is arranged also on the side of the second outside plate 4. The inclusion 9 may be made of a material having an excellent thermal conductivity and a large coefficient of thermal expansion. For example, a graphite sheet may be used for the inclusion 9.

Figure 10:
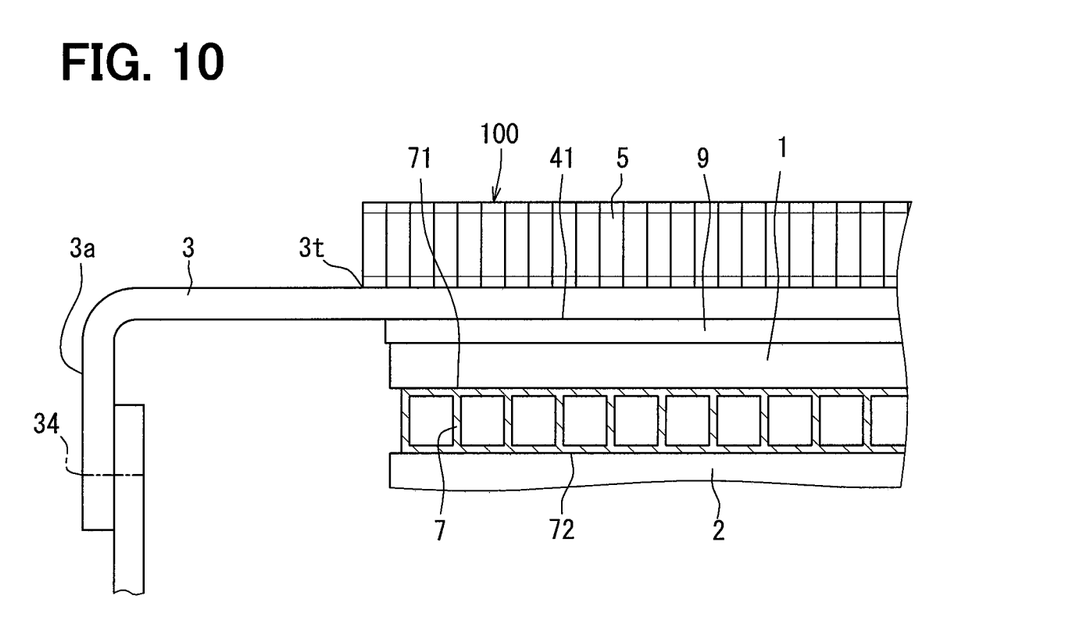
FIG. 10 is a plan view of a part of a thermoelectric power generation device in a fifth embodiment.

Operations and effects of the fifth embodiment will be described. According to the fifth embodiment, the inclusion 9 such as the graphite sheet, which has an excellent heat conductivity, is sandwiched between the first outside plate 3 and the first power generation module 1 and between the second outside plate 4 and the second power generation module 2. A thickness of the graphite sheet does not need to be uniform. In short, a stress as uniform as possible only needs to be applied to the power generation modules 1, 2 to thereby perform uniform heat conduction.

The embodiments have been described above. However, the present disclosure is not limited to the embodiments described above but can be variously modified within a scope not departing from the gist of the present disclosure. The structures of the above embodiments are absolutely shown as examples and the scope of the present disclosure is not limited to the scope described above. The scope of the present disclosure is shown by the scope of the claims and further includes all alterations equivalent to the description of the scope of the claims and within the scope of the claims. Modifications of the above embodiments will be described below.

In the first embodiment, as shown in FIG. 1, the first outside plate 3 is made smaller than the second outside plate 4 and the first outside plate 3 is combined with the second outside plate 4 in such a way that the first outside plate 3 covers the second outside plate 4. However, the first outside plate 3 and the second outside plate 4 may be formed in a same size and may be combined with each other in a state where they are shifted in position from each other.

In the first embodiment, the first outside plate 3 and the second outside plate 4 are welded to each other at the welded portions 34 and the internal space 30 surrounded by the first outside plate 3 and the second outside plate 4 is hermetically sealed. However, the following is also recommended: the internal space 30 is not completely hermetically sealed but is sealed in such a hermetic degree that the high-temperature fluid of a high temperature gas does not have a bad effect on the power generation modules 1, 2 received in the internal space 30. In other words, the first outside plate 3 and the second outside plate 4 may be spot-welded to each other at many spots.

In the first embodiment, the power generation modules 1, 2 are covered by the airtight case constructed of stainless steel and many p-type semiconductor elements and many n-type semiconductor elements are alternately connected to each other in a shape of a net in the airtight case. However, the airtight case may be eliminated and many p-type semiconductor elements and many n-type semiconductor elements may be received in an exposed manner in the internal space 30 surrounded by the first outside plate 3 and the second outside plate 4. In other words, the airtight case is not essential. In this case, the internal space 30 may be hermetically sealed by a cover or the like.

In the first embodiment, portions in which the first outside plate 3 and the second outside plate 4 are in contact with the power generation modules 1, 2 are made to have flat surfaces but may be made to have surfaces having an arbitrary curved shape. In short, a uniform stress as far as possible only needs to be applied to the power generation modules 1, 2.

A low temperature fin to exchange heat with the low-temperature fluid may be provided in the duct 7. Further, in the first embodiment, the flow passage of the low-temperature fluid in the duct 7 is divided, but it is not essential that the flow passage is divided. Still further, the low temperature fin may be formed integrally with the duct 7. In this case, the low temperature fin may be a corrugated fin or a depressed and projected fin protruded from an inside wall surface of the duct 7.

In the first embodiment, the outside fins 5, 6 made of stainless steel or aluminum are joined to the outsides of the first outside plate 3 and the second outside plate 4 made of a steel plate or a stainless steel plate by brazing or the like, but the outside fins 5, 6 may be continuously formed integrally with the first outside plate 3 and the second outside plate 4. In this case, the outside fins 5, 6 may be corrugated fins protruded or bulged from the surfaces of the first outside plate 3 and the second outside plate 4.

In a case where the thermoelectric power generation device 100 shown in the first embodiment is made as a unit and where a plurality of units are laminated to thereby construct the whole thermoelectric power generation device, each unit is inserted into a frame to hold the units. Then, the high-temperature fluid flows in the outside fins 5, 6 between the respective units and the low-temperature fluid flows separately in the respective ducts 7.

As the thermoelectric power generation device an example has been shown in which the exhaust gas of the automobile engine is used as the high-temperature fluid and in which the engine cooling water is used as the low-temperature fluid. However, a high temperature gas of other industrial boiler may be used and the thermoelectric power generation device can be utilized not only for the automobile but also as an exhaust heat recovery device.

The thermoelectric power generation device does not necessarily need to include two power generation modules. The thermoelectric power generation device may include at least one power generation module.

While the present disclosure has been described with reference to embodiments thereof, it is to be understood that the disclosure is not limited to the embodiments and constructions. The present disclosure is intended to cover various modification and equivalent arrangements. In addition, the various combinations and configurations, other combinations and configurations, including more, less or only a single element, are also within the spirit and scope of the present disclosure.

What is claimed is:

1. A thermoelectric power generation device comprising:
   a duct in which a first fluid flows, the first fluid flowing along a longitudinal axis of the duct;
   a first power generation module and a second power generation module which are in contact with opposed outside surfaces of the duct respectively and each of which includes therein a thermoelectric power generation element;
   a first outside plate and a second outside plate each of which is in contact with an outside surface of a corresponding one of the first power generation module and the second power generation module on its opposite side from the duct, each of the first outside plate and the second outside plate having end portions, the end portions of the first outside plate being in contact with and overlapping the end portions of the second outside plate;
   a plurality of welded portions that join the overlapping end portions of the first outside plate with the end portions of the second outside plate; and
   outside fins each of which is provided on an outside surface of a corresponding one of the first outside plate and the second outside plate on its opposite sides from a corresponding one of the first power generation module and the second power generation module, wherein:
   a second fluid having a higher temperature than the first fluid flows in contact with the outside fins;
   a region of each of the first power generation module and the second power generation module, and a region of the duct, which are opposed to each other, apply pressure to and are in contact with each other;
   a region of each of the first power generation module and the second power generation module and a corresponding one of the first outside plate and the second outside plate, which are opposed to each other, apply pressure to and are in contact with each other; and
   the duct is formed from a material having a coefficient of thermal expansion larger than the first outside plate and the second outside plate, the thermoelectric power generation device, further comprising inclusions that are provided respectively:
   between the first power generation module and the duct;
   between the second power generation module and the duct;
   between the first power generation module and the first outside plate; and
   between the second power generation module and the second outside plate, wherein each of the inclusions is formed from a material having a coefficient of thermal expansion larger than the first outside plate and the second outside plate;
   each of the outside fins is constructed of an assembly having a plurality of wave portions, the plurality of wave portions of each of the outside fins overlapping the plurality of wave portions of another of the outside fins, an overlapping direction of the outside fins being in a direction perpendicular to the longitudinal axis of the duct;
   each of the outside fins has a high rigidity to resist expansion and contraction, the high rigidity of the outside fins being in the overlapping direction of the outside fins; and
   the end portions overlap in the overlapping direction of the outside fins to resist bending stress.

2. The thermoelectric power generation device according to claim 1, wherein each of the inclusions includes a graphite sheet.

3. The thermoelectric power generation device according to claim 1, wherein the duct includes a first duct and a second duct that are arranged to be opposed to each other, the thermoelectric power generation device further comprising a central member that is provided between the first duct and the second duct and is formed from a material having a coefficient of thermal expansion larger than the first duct and the second duct.

4. The thermoelectric power generation device according to claim 1, further comprising a central member that is provided inside the duct and is configured from a material having a coefficient of thermal expansion larger than the duct.

5. The thermoelectric power generation device according to claim 4, wherein:
- the duct includes a flexible wall part on a side wall of the duct; and
- the flexible wall part extends due to a thermal expansion of the central member.

6. The thermoelectric power generation device according to claim 1, wherein the duct is formed from a material having a coefficient of thermal expansion larger than iron.

7. The thermoelectric power generation device according to claim 1, wherein a material of the duct is one of aluminum, zinc, duralumin, brass, copper, and magnesium, or a composite thereof.

8. The thermoelectric power generation device according to claim 1, wherein:
- the duct includes therein a plurality of divided passages each of which has a vertically long cross-sectional shape;
- the first fluid flows separately through each of the plurality of divided passages; and
- a vertically long direction of the cross-sectional shape of each of the plurality of divided passages extends in a direction to connect the first power generation module and the second power generation module.

* * * * *